United States Patent [19]

Okumura et al.

[11] Patent Number: 5,335,241
[45] Date of Patent: Aug. 2, 1994

[54] BURIED STRIPE TYPE SEMICONDUCTOR LASER DEVICE

[75] Inventors: Toshiyuki Okumura, Tenri; Kazuhiko Inoguchi, Nara; Fumihiro Konushi, Nara; Haruhisa Takiguchi, Nara, all of Japan

[73] Assignee: Sharp Kabushiki Kaisha, Osaka, Japan

[21] Appl. No.: 751,923

[22] Filed: Aug. 30, 1991

[30] Foreign Application Priority Data

Aug. 30, 1990 [JP] Japan .................................. 2-229961
Sep. 11, 1990 [JP] Japan .................................. 2-241715

[51] Int. Cl.⁵ .................................................. H01S 3/19
[52] U.S. Cl. ................................................................ 372/46
[58] Field of Search ........................ 372/46, 45, 44

[56] References Cited

U.S. PATENT DOCUMENTS 5,020,510 12/1991 Konushi et al. ........................ 372/46

FOREIGN PATENT DOCUMENTS

| 0190737 | 8/1986 | European Pat. Off. . |
| 0206851 | 12/1986 | European Pat. Off. . |
| 0301826 | 2/1989 | European Pat. Off. . |
| 53-67389 | 6/1978 | Japan . |
| 60-077482 | 5/1985 | Japan . |
| 61-183987 | 8/1986 | Japan . |
| 6425590 | 1/1989 | Japan . |
| 1-283890 | 11/1989 | Japan . |
| 2-156588 | 6/1990 | Japan . |

OTHER PUBLICATIONS

*Patent Abstracts of Japan,* vol. 12, No. 304, (E-646) [3151] (18th Aug. 1988).
*Patent Abstracts of Japan* vol. 9, No. 270, (E-353) [1993] (Oct. 26, 1985).
*Patent Abstracts of Japan,* vol. 14, No. 95, (E-089) (Feb. 21, 1990).
Yamamoto et al., *Optoelectronics* (Dec. 1988) 3(2):189-195.

*Primary Examiner*—James W. Davie
*Attorney, Agent, or Firm*—Morrison & Foerster

[57] ABSTRACT

A buried stripe type semiconductor laser device having a mesa stripe whose side faces are {111} facets and having a current confinement structure under epitaxial layers burying the mesa stripe is disclosed. The buried stripe type semiconductor laser device comprises a (100) semiconductor substrate having a stripe-shaped ridge in the <011> direction, a multi-layer film of a double hetero structure formed on the upper surface of the stripe-shaped ridge. The mutil-layer film includes a laser oscillating active layer of a smaller width than that of the stripe-shaped ridge. The current confinement means are formed at both sides of the mesa stripe on the semiconductor substrate. In addition, a method of fabricating a buried stripe type semiconductor laser device having no raised portion above a mesa stripe of a substrate is disclosed. The laser device can be mounted in position with the epitaxial layer side down, without the mesa stripe being damaged or strained.

14 Claims, 6 Drawing Sheets

BURIED STRIPE TYPE SEMICONDUCTOR LASER DEVICE

BACKGROUND OF THE INVENTION

1. Field of the Invention

This invention relates to a buried stripe type semiconductor laser device and a method of producing a buried stripe type semiconductor laser device.

2. Description of the Prior Art

In recent years, semiconductor laser devices are widely used as light sources for various consumer electronics and industrial apparatuses in such applications as optical communications and information processing. In order to meet the device characteristics (such as high output power, high efficiency, and high-speed modulation) required of these semiconductor laser devices, it is necessary to stabilize a transverse oscillation mode and reduce a threshold current. In particular, stabilization of the transverse oscillation mode is important, because it has a close relation with fiber coupling efficiency in optical communications and with optical beam astigmatism in information processing.

Various structures of semiconductor laser devices have been proposed so far for controlling the transverse oscillation mode. Generally, semiconductor laser devices having the Fabry-Perot resonator structure are classified into several types, such as a gain waveguide type having a current confinement structure, a built-in refractive index waveguide type having transverse distribution in a refractive index perpendicular to the cavity length of the resonator, and a refractive index waveguide type in which the sides of the waveguide are buried.

A conventional buried stripe type semiconductor laser device having a buried hereto structure shown in FIG. 6. This buried stripe type semiconductor laser device can emit laser light oscillating stably in a single transverse mode at low threshold currents. The semiconductor laser device is fabricated in the following way.

An n-InP buffer layer 52, a GaInAsP active layer 53, a p-InP cladding layer 54, and a p-GaInAsP cap layer 55 are sequentially grown on an n-InP substrate 51 by a suitable crystal growth method (a first crystal growth process). Then, a stripe-shaped mesa portion (with a width of about 1 μm to 2 μm) is formed along the cavity length of the resonator by photolithography and chemical etching techniques. Subsequently, a p-InP first current stopping layer 56 and an n-InP second current stopping layer 57 are sequentially grown by a suitable crystal growth method in such a manner that the mesa portion is thereby buried (a second crystal growth process). Finally, an n-side electrode 58 is formed on the back of the n-InP substrate 51, and a p-side electrode 59 is formed on the top surfaces of the p-GaInAsP cap layer 55 and n-InP second current stopping layer 57, whereby the semiconductor laser device shown in FIG. 6 can be obtained.

In order to fabricate the buried stripe type semiconductor laser device, two step processes for crystal growth are required, as described above. This complicates the fabrication process sequences and makes it impracticable to form the required device structure in an easily reproducible way.

A buried stripe type semiconductor laser device which can be fabricated by a single-step crystal growth process is proposed (Japanese Laid-Open Patent Publication No. 64-25590). FIG. 7 shows a cross-sectional view of the buried stripe type semiconductor laser device. This semiconductor laser device is fabricated in the following way.

First, a stripe-shaped mesa portion is formed on an n-GaAs substrate 61 having a main surface with a (100) crystal orientation, in the <011> direction by using a suitable etching method. Then, an n-GaAs film 62', an n-AlGaAs film 63', a GaAs film 64', and a p-AlGaAs film 65' are sequentially grown on the n-GaAs substrate 61, by a suitable method for crystal growth (e.g., metal organic vapor phase deposition method). In this process step, on the stripe-shaped mesa portion is formed a multilayer film consisting of an n-GaAs buffer layer 62, an n-AlGaAs first cladding layer 63, a GaAs active layer 64, and a p-AlGaAs second cladding layer 65 and surrounded by (111)B facets. Then, in succession, an n-AlGaAs current stopping layer 66, a p-AlGaAs cladding layer 67, and a p-GaAs cap layer 68 are sequentially grown so as to bury the multilayer film. Finally, an n-side electrode 69 is formed on the back of the n-GaAs substrate 61, and a p-side electrode 70 is formed on the top surface of the p-GaAs cap layer 68, whereby the buried stripe type semiconductor laser device shown in FIG. 7 can be obtained.

In the buried stripe type semiconductor laser device shown in FIG. 7, the top surfaces of individual epitaxial layers grown sequentially over the semiconductor substrate rise along the stripe-shaped mesa portion. Such a tendency is more noticeable in the semiconductor laser devices using an InP substrate.

In fabricating the semiconductor laser device using the GaAs substrate, when epitaxial layers are grown on the GaAs substrate on which a stripe-shaped mesa portion has been formed, the rate of crystal growth on the (111)B facets is substantially zero and, therefore, continuation of crystal growth after a multilayer film surrounded by the (111)B facets will result in an epitaxial growth progressing in such a way that the difference in level between the GaAs substrate and the mesa portion is reduced. In contrast, where the InP substrate is used, the rate of crystal growth on the (111)B facets is considerably greater than in the case where the GaAs substrate is used and, therefore, epitaxial growth is continued while the level difference between the InP substrate and the mesa portion is held as it is. Thus, the resulting configuration will be as shown in FIG. 8.

The buried stripe type semiconductor laser device shown in FIG. 8 comprises an InP substrate 71 having a stripe-shaped ridge, a first multilayer film (including a cladding layer 72 and an active layer 73 formed on the cladding layer 72) formed on the top surface of the stripe-shaped ridge, a second multilayer film including layers 72' and 73' formed on the InP substrate 71, a cladding layer 74 for burying the multilayer films, a contact layer 75 formed on the cladding layer 74, an SiO$_2$ insulating layer 76 formed on the contact layer 75, a p-side electrode 78 formed on the SiO$_2$ insulating layer 76 and the contact layer 75, an n-side electrode 77 formed on the back of the InP substrate 71.

Since the semiconductor laser device shown in FIG. 8 is such that a portion above the mesa portion is in an uprising condition, the laser device cannot be mounted in position with the epitaxial layer side held down. As such, the semiconductor laser device is often subject to thermal influences due to increased resistance to heat and, in addition, the mesa portion is susceptible to damage upon mounting of the device, with the result that some strain is generated in the active region, which leads to decreased reliability.

In order to stabilize the transverse oscillation mode and reduce the threshold current, it is necessary to provide a structure which can prevent the spread of injected currents so as to allow the electric currents to concentratively flow in a laser beam emitting active layer and can efficiently confine the laser lights in the narrow region. In order to fabricate the buried stripe type semiconductor laser device in an easily reproducible manner and to obtain a high yield, the structure must be such that it can be constructed through a single crystal growth process. With semiconductor laser devices of such a structure, in order to define the region for current injection, there must be provided a stripe-shaped electrode or a stripe-shaped impurity diffused region.

FIG. 9 shows a buried stripe type semiconductor laser device having the stripe-shaped impurity diffusion region disposed therein. This semiconductor laser device is fabricated in the following manner.

A stripe-shaped ridge 131 is first formed on an n-InP substrate 130 having (100) surface in [011] direction. Then, an n-InP film 132', a GaInAsP film 133', and a p-InP film 134' are sequentially grown on the n-InP substrate 130 on which the stripe-shaped ridge 131 is formed. In this process step, on the upper surface of the stripe-shaped ridge 131 is formed a multilayer film of a double hereto structure having a triangular sectional configuration perpendicular to the cavity length of the resonator and which is surrounded by (111)B facets, that is, a multilayer film whose slat faces are (111)B facets grown from opposite ends of the stripe-shaped ridge 131. This multilayer film consists of an n-InP first cladding layer 132, a GaInAsP active layer 133, and a p-InP second cladding layer 134. In this case, the p-InP film 134' grows to a thickness such that the p-InP film 134' does not go above the GaInAsP active layer 133 of the double hereto structure formed on the upper surface of the stripe-shaped ridge 131. However, InP crystal grows also on the (111)B facets of the multilayer film, therefore, as shown in FIG. 9, the p-InP film 134' covers the multilayer film of the double hereto structure.

Subsequently, an n-InP buried layer 135 and a p-GaInAsP contact layer 136 are sequentially grown so as to bury the stripe-shaped ridge 131 covered with the p-InP film 134'. Then, Zn is diffused in a stripe pattern so that it reaches the p-InP second cladding layer 134, in order to form a Zn diffused region 137 for current injection. Finally, an n-side electrode 138 is formed on the back of the n-InP substrate 130 and a p-side electrode 139 is formed on the surface of the p-GaInAsP contact layer 136. Thus, the semiconductor laser device shown in FIG. 9 is obtained.

In the semiconductor laser device shown in FIG. 9, the n-InP film 132', GaInAsP film 133', and p-InP film 134' are formed on a plateau at both sides of the stripe-shaped ridge 131 as stated above. Therefore, in order for injection current to concentratively flow into the multilayer film of the double hereto structure formed on the top surface of the stripe-shaped ridge 131, the stripe-shaped Zn diffused region 137 was formed to extend from the p-side electrode 139 to the p-InP second cladding layer 134.

However, the p-InP film 134' is grown also on the (111)B facet of the multilayer film, and this does not permit satisfactory current confinement by the p-n junction reverse bias generated in the burying layer. As a consequence, considerable current leaks through the p-InP film 134', which increases threshold currents.

SUMMARY OF THE INVENTION

The buried stripe type semiconductor laser device of this invention, which overcomes the above-discussed and numerous other disadvantages and deficiencies of the prior art, comprises: a semiconductor substrate of a first conductivity type having a main surface with a (100) crystal orientation; a mesa stripe formed in said main surface of said semiconductor substrate, said mesa stripe being oriented along the <011> direction and having a top surface with a (100) crystal orientation; a multilayer structure formed on said top surface of said mesa stripe, said multilayer structure including an active layer for a laser oscillation, side faces of said multilayer structure being {111} facets; and current confinement means for confining electric currents within said mesa stripe, said current confinement means being formed at sides of said mesa stripe on said main surface of said semiconductor substrate.

According to the invention, a semiconductor laser device is provided, comprising: a semiconductor substrate of a first conductivity type having a main surface with a (100) crystal orientation; a mesa stripe formed in said main surface of said semiconductor substrate, said mesa stripe being oriented along the <011> direction and having a top surface with a (100) crystal orientation; a multilayer structure formed on said top surface of said mesa stripe, said multilayer structure including an active layer for a laser oscillation, side faces of said multilayer structure being {111} facets; and current confinement means for confining electric currents within said mesa stripe, said current confinement means being formed on said main surface of said semiconductor substrate.

In a preferred embodiment, said current confinement means include a semiconductor layer of a second conductivity type formed on said main surface of said semiconductor substrate.

In a preferred embodiment, said current confinement means include a semi-insulating semiconductor layer formed on said main surface of said semiconductor substrate.

In a preferred embodiment, said current confinement means include a region of said semiconductor substrate, and said region is doped with impurities for forming deep-level traps.

Thus, the buried stripe type semiconductor laser device of the invention comprises current confinement means formed in other surface region of or on other surface region of the semiconductor substrate than at least a portion of the upper surface of the stripe-shaped ridge.

According to the invention, a multilayer film of a double hereto structure including an active layer is on a (001) semiconductor substrate having a stripe-shaped ridge in the <011> direction, crystal growth occurs independently on the upper surface of the stripe-shaped ridge and in regions located at both sides of the ridge. On the upper surface of the stripe-shaped ridge is formed a multilayer film of a double hereto structure having a section perpendicular to the cavity length of the resonator which is of a trapezoidal configuration and surrounded by (111)B facets, that is, a multilayer film whose slat surfaces are the {111} facets grown from both ends of the stripe-shaped ridge at the angle of about 54.7 degree relative to the (100) surface of the semiconductor substrate. Therefore, the active layer smaller in width than the stripe-shaped ridge can be formed in a highly reproducible way. The layer formed on other than at least a portion of the upper surface of the stripe-shaped ridge functions as current confinement means. Therefore, the multi-layer film of double hereto structure, including an active layer, formed on the surface of the stripe-shaped ridge is buried in a self-aligned manner by crystal growth from both sides of the stripe-shaped ridge, whereby the buried stripe type semiconductor laser device of the invention can be readily obtained.

According to the invention, a method of fabricating a semiconductor laser device is provided, comprising the steps of: forming a mesa stripe on a semiconductor substrate of a first conductivity type which has a (100) crystal orientation, by a selective etching method using a stripe-shaped mask, said mesa stripe being oriented along the <011> direction and having a top surface with a (100) crystal orientation; forming a current blocking layer on plateau regions at both sides of said mesa stripe by a selective growth method using said stripe-shaped mask; removing said stripe-shaped mask; forming a multilayer structure on said top surface of said mesa stripe, said multilayer structure including an active layer for a laser oscillation, side faces of said multilayer structure being {111} facets; forming a semiconductor layer of a second conductivity type to cover said multilayer structure; and forming a contact layer on said semiconductor layer.

According to the invention, a method of fabricating a buried stripe type semiconductor laser device is provided, comprising the steps of: forming a mesa stripe on a semiconductor substrate of a first conductivity type which has a (100) crystal orientation, said mesa stripe being oriented along the <011> direction and having a top surface with a (100) crystal orientation; forming a multilayer structure on said top surface of said mesa stripe, said multilayer structure including an active layer for a laser oscillation, side faces of said multilayer structure being {111} facets; forming at least one first semiconductor layer to cover said multilayer structure; forming a second semiconductor layer of a second conductivity type on said first semiconductor layer; forming a third semiconductor layer on said second semiconductor layer, said third semiconductor layer having different etching characteristics than that of said second semiconductor layer; and selectively etching a ridged portion of said third semiconductor layer to planarize a surface of said third semiconductor layer.

In the fabrication method of the invention, a stripe-shaped mesa portion is first formed on a semiconductor substrate of a first conductivity type having a (100) surface in the <011> direction. It is noted in this connection that the <011> direction represents all directions which are crystallographically equivalent to the <011> direction and embraces, for example, the [01$\bar{1}$] direction. For formation of the mesa portion, conventional photolithographic and etching techniques are employed.

A multilayer film of a double hereto structure including a laser oscillating active layer, a cap layer of a second conductivity type, and an upper semiconductor layer are sequentially formed on the substrate with the mesa portion. In this process stop, the multilayer film is grown on the mesa portion in such a way that it is surrounded by the {111} facets. It is noted in this connection that a {111} facet represents all crystal surfaces which are crystallographically equivalent to the (111) facet, including, for example, a (111)B facet. A buffer layer, a cladding layer, a current stopping layer for current constriction, and so on may be formed at suitable locations as required. For the growth of these semiconductor layers, conventional crystal growing techniques including a metal organic chemical vapor phase deposition (MOCVD) method, for example, are employed.

The upper semiconductor layer is usually grown in such a way that its thickness is equal to or greater than the height of the stripe-shaped mesa portion. The upper semiconductor layer must be different in its element composition from the cap layer, because at a later stage, the upper semiconductor layer and the cap layer must be subjected to etching at different rates of etching. The upper semiconductor layer is preferably of the same conductivity type as that of the semiconductor substrate, that is, of the first connectivity type, or is semi-insulating.

Thus, the raised portion of the upper semiconductor layer which is located above the mesa portion is removed and accordingly the surface above the mesa portion becomes level with or lower than the surface at opposite sides of the mesa portion. To remove a portion of the upper semiconductor layer, conventional photolithographic and etching techniques are employed.

According to the invention, any raised portion of the upper semiconductor layer above the mesa portion is removed by etching, whereby the surface above the mesa portion is made level with or lower than the surface at both sides of the mesa portion. The semiconductor laser device thus obtained is mountable in position with the epitaxial layer side down and, therefore, is less liable to any thermal influence.

Thus, the invention described herein makes possible the objectives of:

(1) providing a buried stripe type semiconductor laser device having advantages of reduced current leakage, reduced threshold current level, and transverse mode oscillation stability;

(2) providing a buried stripe type semiconductor laser device wherein formation of a doped region with Zn or the like impurity atoms is not needed; and (3) providing a method of fabricating a buried stripe type semiconductor laser device which is mountable with an epitaxial layer side down and less subject to a thermal influence.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

EXAMPLE 1

Figure 1:
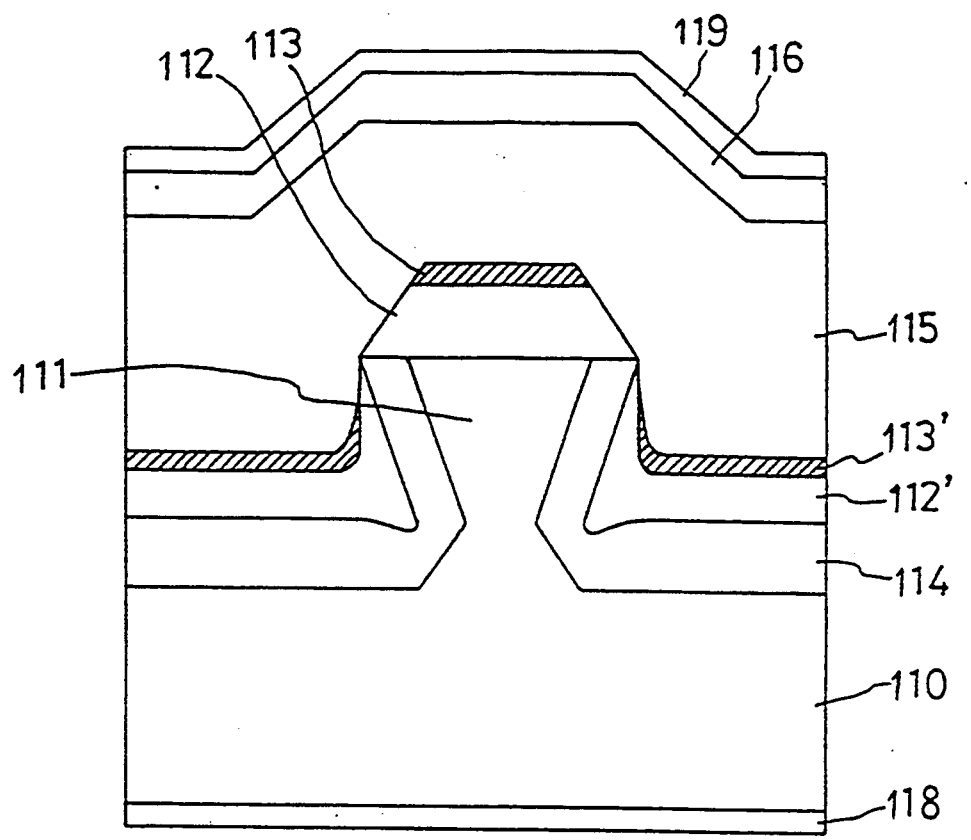
FIG. 1 is a cross-sectional view of a first embodiment of the present invention.

FIG. 1 shows a cross-sectional view of a first embodiment of the invention. In the first embodiment, a semi-insulating current confinement layer is used as current confinement means, This semiconductor laser device was fabricated according to the following procedure.

First, a photoresist was coated on an n-InP substrate 110 having a main surface with a (100) crystal orientation (n-InP (100) substrate 110), and a stripe-shaped opening extending in the [011] direction was formed in the photoresist by using a 4 μm wide mask pattern. An $Al_2O_3$ film (250 nm thick) was formed all over the n-InP substrate 110 by an electron beam evaporation method, and then a stripe-shaped $Al_2O_3$ mask 117 having a width of 4 μm was formed by a lift-off technique.

Figure 2A:
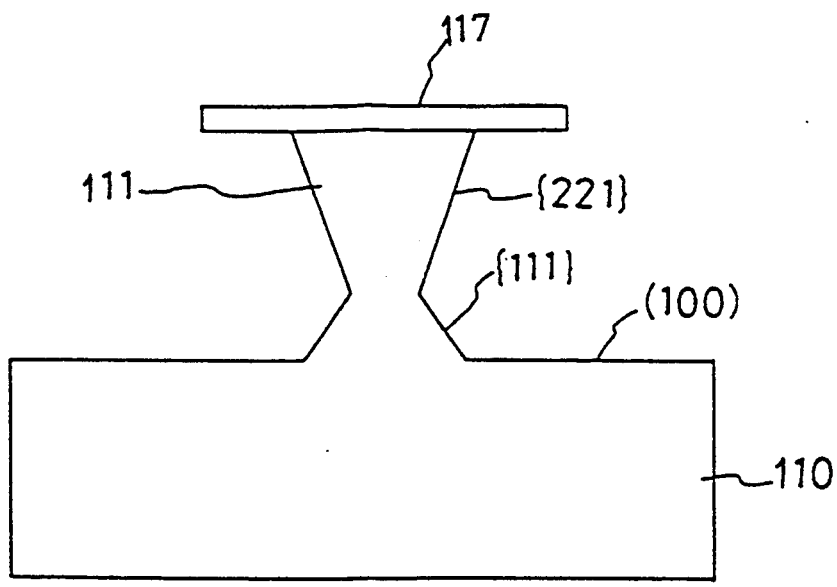
FIGS. 2A and 2B are cross-sectional views illustrating the process sequence of fabricating the first embodiment of the present invention.

Next, as shown in FIG. 2A, an inverse mesa ridge (stripe-shaped ridge) 111 having a width of 2 μm was formed by a chemical etching technique using an $H_2SO_4$ etchant ($H_2SO_4:H_2O_2:H_2O=3:1:1$, 60° C.). In this embodiment, each of side faces of the stripe-shaped ridge 111 comprises a {221} facet and a {111} facet.

Figure 2B:
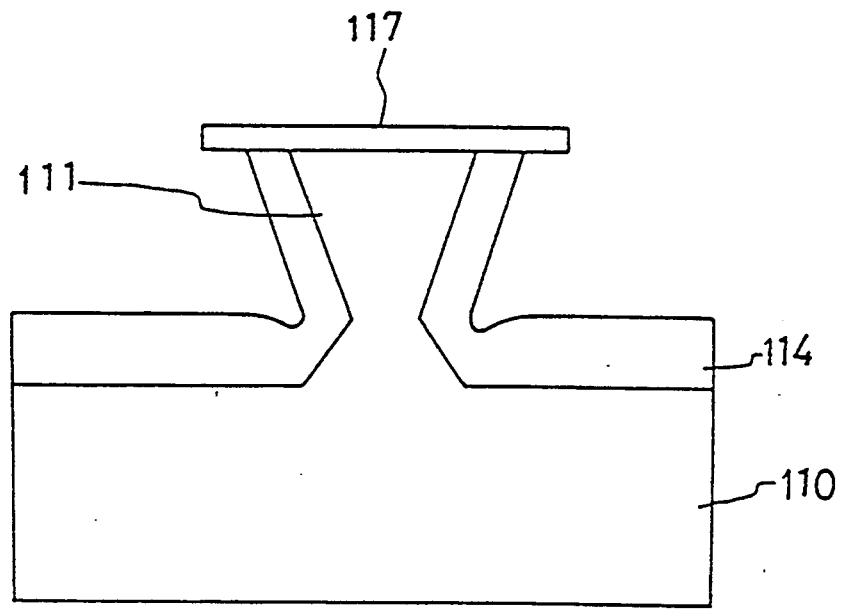

Subsequently, as shown in FIG. 2B, an Fe-doped InP layer (current blocking layer) 114 (having a thickness of about 0.5 μm on plateau regions at both sides of the stripe-shaped ridge 111) was grown by an MOCVD method, with the stripe-shaped $Al_2O_3$ mask 117 left as such. In this process step, the Fe-doped InP layer 114 was grown on both the {221} facets and the {111} facets of the stripe-shaped ridge 111, the rate of growth on the {111} facets being smaller than that on the {221} facets. The {111} facet was located between the {221} facet and the (100) surface, and was relatively small in area. Therefore, side faces of the stripe-shaped ridge 111, namely, the {221} facets and the {111} facets, and the (100) surface that is the main surface of the n-InP substrate 110 at both sides of the stripe-shaped ridge 111 were all covered with the Fe-doped InP layer 114. Thereafter, the stripe-shaped $Al_2O_3$ mask 117 was removed using an HF solution, with the result that the n-InP substrate 110 having a current confinement structure was obtained. In this embodiment, the Fe-doped InP layer 114 was of high resistance and functionable as a semi-insulating current confinement layer.

On the n-InP substrate 110 having the current confinement structure were sequentially grown an Si-doped n-InP film 112' (with a thickness of 0.5 μm on the plateau) and a non-doped GaInAsP film 113' (with a thickness of 0.2 μm on the plateau) by a Low-Pressure MOCVD method. As shown in FIG. 1, on the top surface of the stripe-shaped ridge 111 was formed a multilayer film of a double hereto structure having a trapezoidal section perpendicular to the cavity length of the resonator which was surrounded by the (111)B facets. The slat surfaces of the multilayer film were the (111)B facets grown from the both ends of the stripe-shaped ridge 111. This multilayer film consisted of an Si-doped n-InP buffer layer 112 (carrier concentration: $1 \times 10^{18}$ cm$^{-3}$), and a non-doped GaInAsP active layer 113 (wavelength of emitted light: 1.3 μm).

Subsequently, a Zn-doped p-InP cladding layer 115 (carrier concentration: $5 \times 10^{17}$ cm$^{-3}$, 2.5 μm in thickness on the plateau regions), and a Zn-doped p-GaInAsP contact layer 116 (carrier concentration: $1 \times 10^{18}$ cm$^{-3}$, 0.5 μm in thickness at the plateau) were sequentially grown.

In this embodiment, above the stripe-shaped ridge 111, the growth of GaInAsP crystal occurred only on the (100) surface because of the dependence of growth rate upon surface orientation, whereas the growth of InP crystal occurred not only on the (100) surface, but also on the (111)B facets, though the rate of crystal growth on the (111)B facets was less than one tenth of that on the (100) surface. Therefore, the multilayer of the double hereto structure was grown to form a trapezoidal sectional configuration perpendicular to the cavity length of the resonator, according to the dependence of crystal growth rate upon surface orientation.

A multilayer film of similar construction was also grown on the (100) surface at both sides of the stripe-shaped ridge 111. As the Zn-doped p-InP cladding layer 115 was grown, the rate of crystal growth became uniform on all of the surfaces including the (111)B facets, and the multilayer film of the double hereto structure formed on the top of the stripe-shaped ridge 111 was buried by the Zn-doped p-InP cladding layer 115.

The angle between side faces of the multilayer film on the stripe-shaped ridge 111 and the bottom face of the multilayer film corresponds to an angle between a (100) face and a (111)B face. The angle was crystallographically kept at about 54.7 degree. Therecfore, by forming a stripe-shaped ridge 111 having a width of 3 μm, it is possible to set the width of the non-doped GaInAsP active layer 113 at 2 μm (a width necessary for attaining single transverse mode oscillation) in an easily reproducible manner.

Finally, an n-side AuGe electrode 118 was formed on the back of the n-InP substrate 110, and a p-side AuZn electrode 119 on the surface of the Zn-doped p-GaInAsP contact layer 116. Thus, the buried stripe type semiconductor laser device shown in FIG. 1 was obtained.

In this embodiment, the multilayer film of the double hereto structure including the non-doped GaInAsP active layer 113 was selectively grown by utilizing the Low-Pressure MOCVD technique. Therefore, the width of the active layer was easily set at about 2 μm with good accuracy and in an easily reproducible manner. Further, the current confinement structure using the high-resistance Fe-doped InP layer 114 was previously formed on the n-InP substrate 110, and accordingly the buried stripe type semiconductor laser device was easily obtained simply by burying both sides of the stripe-shaped ridge 111 in the Zn-doped p-InP cladding layer 115. Therefore, the semiconductor laser device exhibits steady oscillation in the single transverse mode and excellent device characteristics, such as a decreased leakage current and a low threshold current.

In the first embodiment, the Fe-doped InP layer 114 was used as the semi-insulating current confinement layer. However, a semiconductor layer of a different conductivity type from that of the semiconductor substrate can be used as the current confinement layer. For example, a p-type semiconductor layer which is of a different conductivity type from that of the n-InP substrate 110 may be used. In this case, the conductivity type of the semiconductor substrate (or first conductivity type) is n-type, and the conductivity type of the current confinement layer (or second conductivity type) is p-type. Conversely, it may be arranged that the first conductivity type is p-type and the second conductivity type is n-type.

In the processes of fabricating the first embodiment, the Low-Pressure MOCVD technique was employed for forming the current confinement structure on the n-InP substrate 110 and for growing the multilayer film of the double hereto structure including the non-doped GaInAsP active layer 113. Alternatively, an Atomospheric-Pressure MOCVD or a vapor phase epitaxial growth (VPE), or a molecular beam epitaxial growth (MBE) technique may be employed.

For orientation of the stripe-shaped ridge, the [011] direction was selected, but a [01$\bar{1}$] direction (a crystallographically equivalent direction) may be selected to obtain a similar result.

In the first embodiment, the buried stripe type semiconductor laser device was of the InP-GaInAsP type. Likewise, GaAs-AlGaAs and other compound semiconductors including multi-mixed crystal systems may be used for the buried stripe type semiconductor laser device of the invention, with similar excellent results.

As described above, according to the invention, an active layer of a narrow width can be formed in a well reproducible manner in the manufacture of a buried stripe type semiconductor laser device. In addition, leakage currents can be reduced without forming any stripe-shaped region doped with impurity atoms in the burying layers. Therefore, it is possible to obtain a buried stripe type semiconductor laser device which reduces a threshold current level and attains a stable oscillation in single transverse mode, and which can be fabricated with good yield.

EXAMPLE 2

Figure 3:
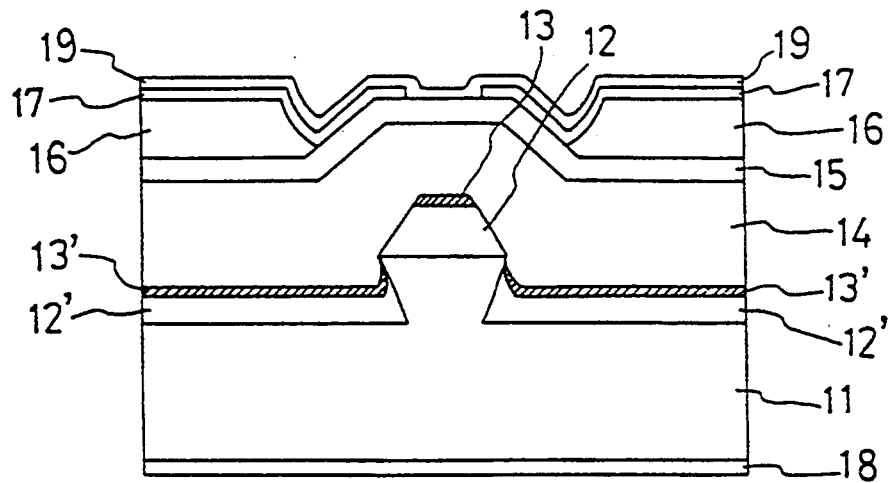
FIG. 3 is a cross-sectional view of a second embodiment of the present invention.

FIG. 3 shows a cross-sectional view of a second embodiment of a buried stripe type semiconductor laser device according to the invention. The buried stripe type semiconductor laser device was fabricated in the following way.

Figure 4A:
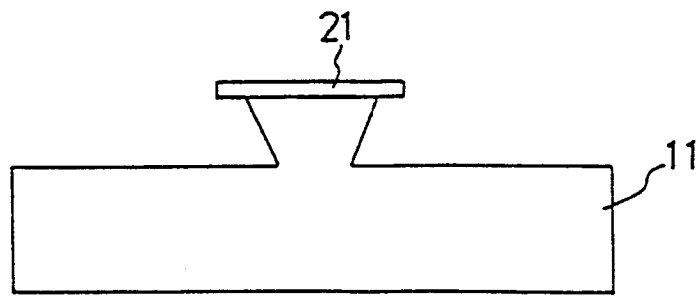
FIGS. 4A through 4C are cross-sectional views illustrating the process sequence of fabricating the second embodiment of the present invention.

First, an SiO$_2$ film 21 (see FIG. 4A) was deposited on an n-InP substrate 11 having a main surface with a (100) crystal orientation. Then, the SiO$_2$ film 21 was selectively etched by photolithography and chemical etching techniques using HF to form a stripe-shaped etching mask extending in the [011] direction. Next, the n-InP substrate 11 was selectively etched by a chemical etching method using a mixture solution of H$_2$SO$_4$, H$_2$O$_2$ and H$_2$O (3:1:1), whereby an inverse mesa ridge (1.8 $\mu$m high, 3 $\mu$m wide) was formed as shown in FIG. 4A.

Figure 4B:
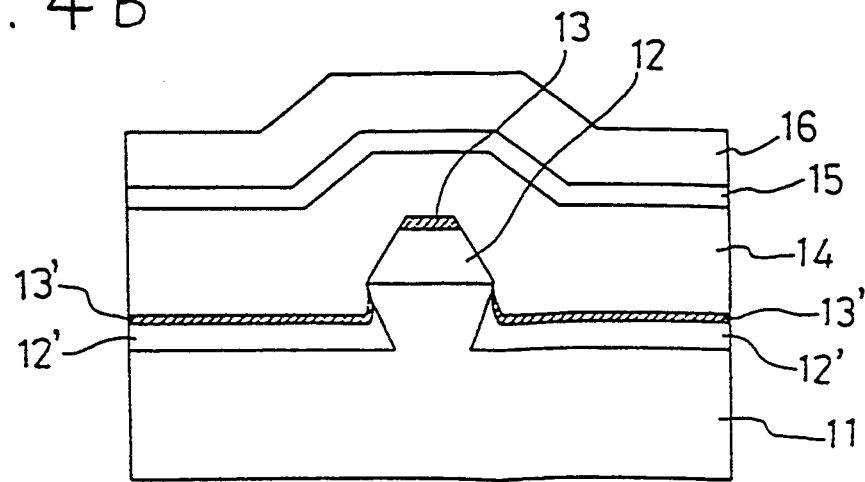

After the etching mask was removed, an n-InP film 12' (0.7 $\mu$m thick), and a Ga$_{0.24}$In$_{0.76}$As$_{0.55}$P$_{0.45}$ film 13' (0.1 $\mu$m thick) were sequentially grown over the n-InP substrate 11 by an MOCVD method. In this step, as shown in FIG. 4B, on the mesa portion was formed a multilayer film of a double hereto structure having a section of a trapezoidal configuration perpendicular to the cavity length of the resonator and surrounded by the (111)B facets. That is, the slat faces of the multilayer film are the (111)B facets. This multilayer film consists of an n-InP buffer layer 12 and a Ga$_{0.24}$In$_{0.76}$As$_{0.55}$P$_{0.45}$ active layer 13.

Subsequently, a p-InP cladding layer 14 (2.0 $\mu$m thick), a p-Ga$_{0.53}$In$_{0.47}$As cap layer 15 (0.5 $\mu$m thick), and an n-InP upper semiconductor layer 16 (1.8 $\mu$m thick) were sequentially grown. As crystal growth progresses at both sides of the mesa portion, crystal growth occurred at a uniform rate on all the surfaces including the (111)B facets and thus a buried stripe type structure shown in FIG. 4B was obtained.

Figure 4C:
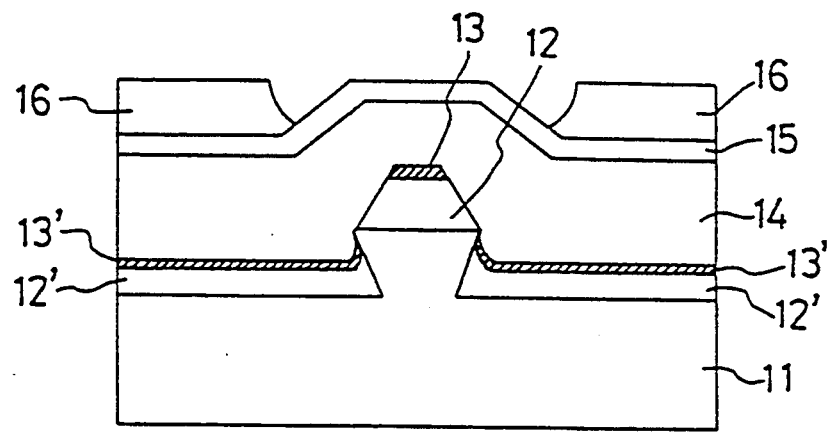

Next, as shown in FIG. 4C, the raised portion of the n-InP upper semiconductor layer 16 above the mesa portion was selectively removed by the photolithography and chemical etching techniques, so that the surface above the mesa portion was made even with the surface at both sides thereof. A mixture solution of HCl and H$_2$O (4:1) was used as an etchant, whereby the n-InP upper semiconductor layer 16 only could be selectively etched without etching the p-Ga$_{0.53}$In$_{0.47}$As cap layer 15.

Finally, an SiO$_2$ insulating film 17 was deposited all over; and after the stripe portion of the SiO$_2$ insulating film 17 which would serve as a current injection region was removed by etching, an n-side electrode 18 was formed on the back of the n-InP substrate 11; and a p-side electrode 19 was formed on the surface of the SiO$_2$ insulating film 17 and on the surface of the p-Ga$_{0.53}$In$_{0.47}$As cap layer 15 exposed to the stripe portion of the film 17. Thus, the buried stripe type semiconductor laser device shown in FIG. 3 was obtained.

Another buried stripe type semiconductor laser device was fabricated in the same manner as described above, except that the inverse mesa ridge had a smaller width of the order of 1.5 $\mu$m. The buried stripe type semiconductor laser device was equally reproducible.

The semiconductor laser device thus fabricated had a surface above the mesa portion which was even with or lower than the surface at both sides thereof, and was mounted in position with the epitaxial layer side down. The device was far much less liable to any thermal influence, such as temperature rise due to heat generation, and exhibited satisfactory device characteristics.

EXAMPLE 3

Figure 5:
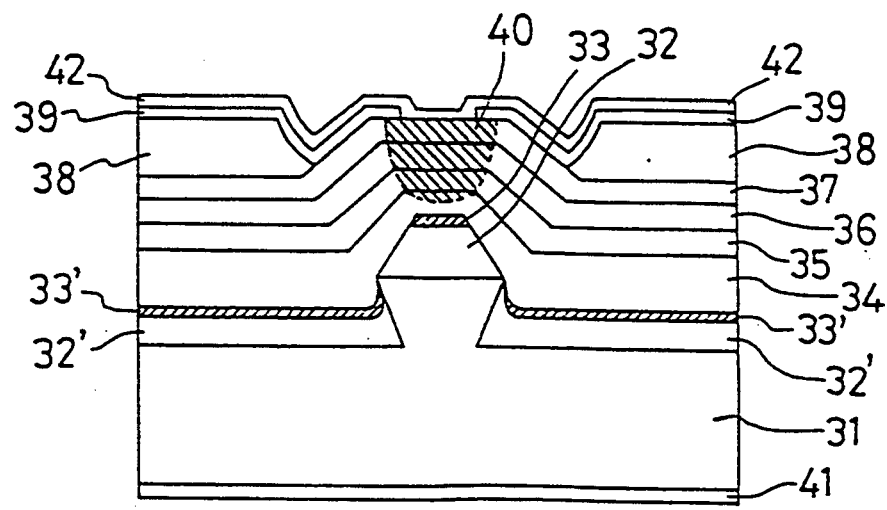
FIG. 5 is a cross-sectional view of a third embodiment of the present invention.
Figure 6:
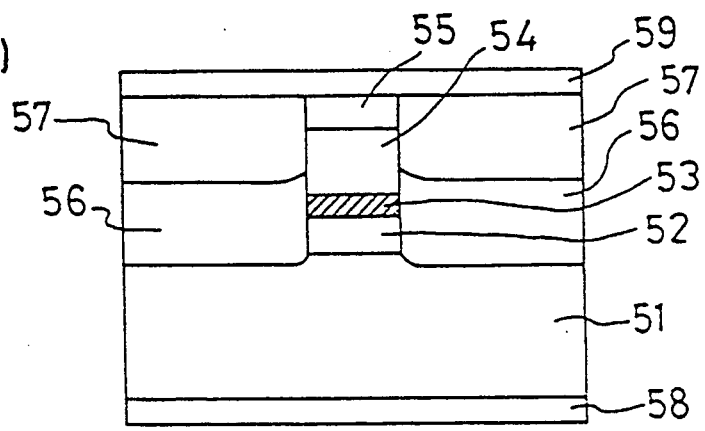
FIGS. 6 through 9 are cross-sectional views illustrating prior arts.
Figure 7:
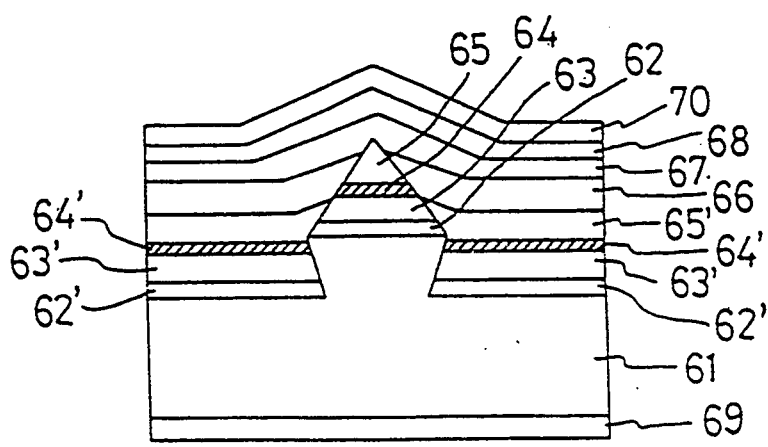
Figure 8:
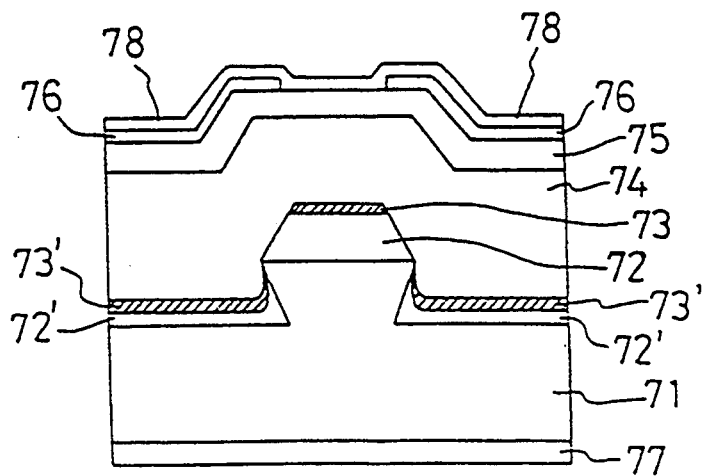
Figure 9:
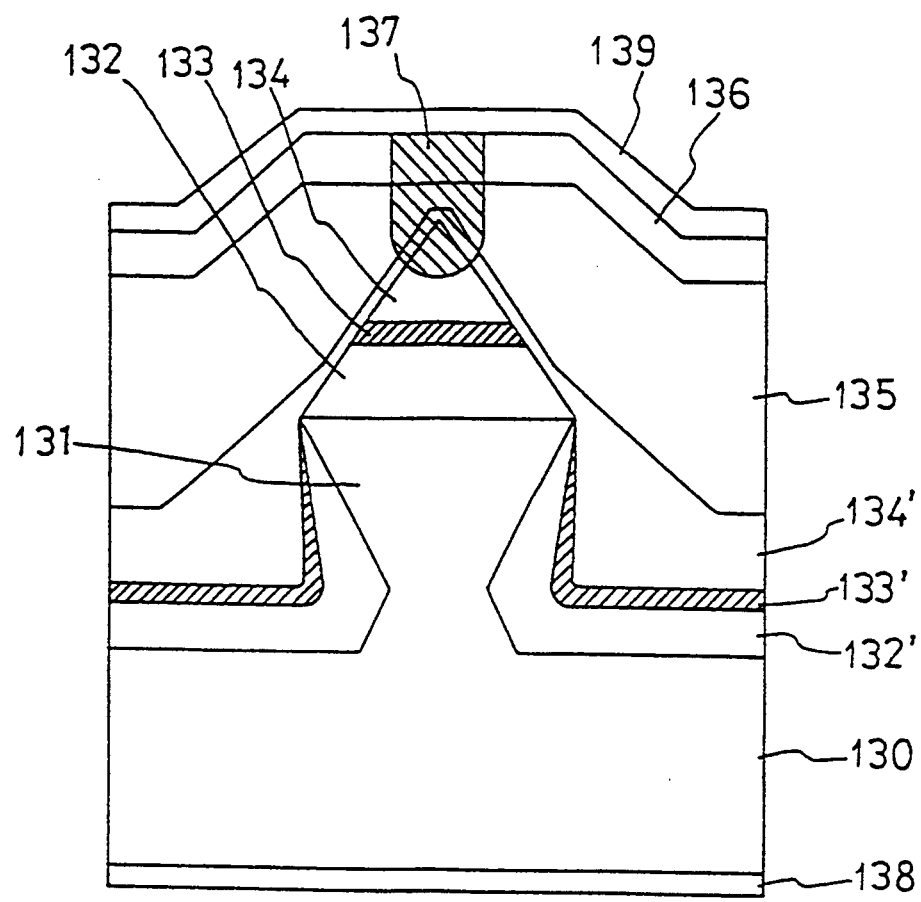

FIG. 5 shows a cross-sectional view of a third embodiment of a buried stripe type semiconductor laser device according to the invention. The buried stripe type semiconductor laser device was fabricated in the following way.

First, an inverse mesa ridge (1.8 $\mu$m high, 3 $\mu$m wide) was formed on an n-InP substrate 31 having a (100) surface in the same manner as in Example 2. Then, on the n-InP substrate 31 with the mesa portion were sequentially grown an n-InP film 32' (0.7 $\mu$m thick), and a Ga$_{0.24}$In$_{0.76}$As$_{0.55}$P$_{0.45}$ film 33' (0.1 $\mu$m thick) in the same manner as in Example 2 using the MOCVD method. In this step, on the mesa portion was formed a multilayer film of a double hereto structure having a section of a trapezoidal configuration perpendicular to the cavity length of the resonator and surrounded by (111)B facets. That is, the slat faces of the multilayer film were the (111)B facets grown from both edges of the mesa portion. This multilayer film consists of an n-InP buffer layer 32 and a Ga$_{0.24}$In$_{0.76}$As$_{0.55}$P$_{0.45}$ active layer 33.

Subsequently, a p-InP cladding layer 34 (1.0 $\mu$m thick), an n-InP current stopping layer 35 (0.5 $\mu$m thick), a p-InP cladding layer 36 (1.0 $\mu$m thick), a p-Ga$_{0.53}$In$_{0.47}$As cap layer 37 (0.5$\mu$m thick), and an n-InP upper semiconductor layer 38 (1.8 $\mu$m thick) were sequentially grown to bury the multilayer film.

Next, the raised portion of the n-InP upper semiconductor layer 38 above the mesa portion was selectively removed by the photolithographic and chemical etching techniques, so that the surface above the mesa portion was made even with the surface at both sides thereof. A mixture solution of HCl and H₂O (4:1) was used as an etchant.

Next, an SiO₂ insulating film 39 was deposited all over and, after the stripe portion thereof was removed by etching to form a stripe window in the SiO₂ insulating film 39, Zn was diffused through the stripe window to form a Zn-diffused region 40 in the burying layers. Further, the conductivity type of that portion of the n-InP current stopping layer 35 which was located above the mesa portion was inverted into p-type, and an n-side electrode 41 was formed on the back of the n-InP substrate 31, and a p-side electrode 42 was formed on the surface of the SiO₂ insulating film 39 and on the Zn-diffused region 40 which was exposed to the stripe portion of the insulating film 39. Thus, the buried stripe type semiconductor laser device shown in FIG. 5 was obtained.

The semiconductor laser device was provided with an n-InP current stopping layer 35. In addition, the conductivity type of that portion of the current stopping layer 35 which was located above the mesa portion was inverted into p-type by Zn diffusion. Therefore, by virtue of a p-n junction, injected currents can be confined more accurately, and thus the threshold current level can be further reduced.

In the third embodiment, the conductivity type of the semiconductor substrate (i.e., first conductivity type) is n-type, the conductivity type of the cap layer (i.e., second conductivity type) is p-type. Conversely, it may be arranged that the first conductivity type is p-type and the second conductivity type is n-type. For orientation of the stripe-shaped mesa portion to be formed on the semiconductor substrate, the [011] direction was selected. Alternatively, the [01$\bar{1}$] direction which is crystallographically equivalent may be selected, with similar effects being obtainable.

In the third embodiment, the buried stripe type semiconductor laser device was of the InP-GaInAsP type. Likewise, the method of the invention is equally applicable to GaAs-AlGaAs and other compound semiconductors including multi-mixed crystal systems, with similar satisfactory results.

As already stated, according to the invention, it is possible to obtain a buried stripe type semiconductor laser device which attains much less threshold oscillation current level and is stable in single transverse mode oscillation. The semiconductor laser device has no raised portion above the mesa portion. Therefore, it can be satisfactorily mounted in position with the epitaxial layer side down, without the mesa portion being damaged or strained. Therefore, the device is little liable to any thermal influence, such as temperature rise due to heat generation, and is highly reliable.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. A semiconductor laser device comprising:
   a semiconductor substrate of a first conductivity type having a main surface with a (100) crystal orientation;
   a mesa stripe formed in said main surface of said semiconductor substrate, said mesa stripe being oriented along the <011> direction and having a top surface with a (100) crystal orientation;
   a multilayer structure formed on said top surface of said mesa stripe, said multilayer structure including an active layer for a laser oscillation, side faces of said multilayer structure being {111} facets;
   current confinement means for confining electric currents within said mesa stripe, said current confinement means being formed on said main surface of said semiconductor substrate and at sides of said mesa stripe.

2. A semiconductor laser device according to claim 1, wherein said current confinement means include a semiconductor layer of a second conductivity type formed on said main surface of said semiconductor substrate and at sides of said mesa stripe.

3. A semiconductor laser device according to claim 1, wherein said current confinement means include a semiconductor layer formed on said main surface of said semiconductor substrate and at sides of said mesa stripe.

4. A semiconductor laser device comprising:
   a semiconductor substrate of a first conductivity type having a main surface with a (100) crystal orientation;
   a mesa stripe formed in said main surface of said semiconductor substrate, said mesa stripe being oriented along the <011> direction and having a top surface with a (100) crystal orientation, said mesa stripe being formed by a portion of said semiconductor substrate;
   a multilayer structure formed on said top surface of said mesa stripe, said multilayer structure including an active layer for a laser oscillation, side faces of said multilayer structure being {111} facets;
   at least one semiconductor layer which covers said multilayer structure, a top surface of said semiconductor layer having a raised portion above said multilayer structure; and
   current confinement means for confining electric currents within said mesa stripe, said current confinement means including an additional semiconductor layer formed on said at least one semiconductor layer, said additional semiconductor layer locating above regions of said main surface of said semiconductor substrate where said mesa stripe is not formed.

5. A semiconductor laser device according to claim 4, wherein said current confinement means include a region of said semiconductor substrate, said region being doped with impurities for forming deep-level traps.

6. A semiconductor laser device according to claim 4, wherein said additional semiconductor layer has an opening, said opening being located above said mesa stripe.

7. A semiconductor laser device according to claim 6, wherein said current confinement means includes an insulating layer formed on said additional semiconductor layer.

8. A semiconductor laser device according to claim 6, wherein said at least one semiconductor layer is of a second conductivity type, and said additional semiconductor layer is of said first conductivity type.

9. A semiconductor laser device according to claim 7, wherein said at least one semiconductor layer is of a second conductivity type, and said additional semiconductor layer is of said first conductivity type.

10. A semiconductor laser device comprising:
- a semiconductor substrate of a first conductivity type having a main surface with a (100) crystal orientation;
- a mesa stripe formed in said main surface of said semiconductor substrate, said mesa stripe being oriented along the <011> direction and having a top surface with a (100) crystal orientation, said mesa stripe being formed by a portion of said semiconductor substrate;
- a multilayer structure formed on said top surface of said mesa stripe, said multilayer structure including an active layer for a laser oscillation, side faces of said multilayer structure being (111) facets;
- at least one semiconductor layer which covers said multilayer structure, a top surface of said semiconductor layer having a raised portion above said multilayer structure; and
- current confinement means for confining electric currents within said mesa stripe, said current confinement means including an additional semiconductor layer formed on said at least one semiconductor layer, said additional semiconductor layer being located above regions of said main surface of said semiconductor substrate where said mesa stripe is not formed, and wherein said device has a substantially flat top surface.

11. A semiconductor laser device according to claim 10, wherein said additional semiconductor layer has an opening, said opening being located above said mesa stripe.

12. A semiconductor laser device according to claim 11, wherein said current confinement means includes an insulating layer formed on said additional semiconductor layer.

13. A semiconductor laser device according to claim 11, wherein said at least one semiconductor layer is of a second conductivity type, and said additional semiconductor layer is of said first conductivity type.

14. A semiconductor laser device according to claim 12, wherein said at least one semiconductor layer is of a second conductivity type, and said additional semiconductor layer is of said first conductivity type.

* * * * *